United States Patent
Parkhomenko et al.

[19]

[11] Patent Number: 6,008,699
[45] Date of Patent: Dec. 28, 1999

[54] DIGITAL RECEIVER LOCKING DEVICE

[75] Inventors: Viktor Nikolaevich Parkhomenko; Mikhail Jurievich Rodionov, both of Zelenograd; Mikhail Natanovich Lurie, Moscow, all of Russian Federation

[73] Assignee: Samsung Electronics Co., Ltd., Suwon, Rep. of Korea

[21] Appl. No.: 09/101,936

[22] PCT Filed: Dec. 24, 1996

[86] PCT No.: PCT/RU96/00360

§ 371 Date: Jul. 28, 1998

§ 102(e) Date: Jul. 28, 1998

[87] PCT Pub. No.: WO98/28851

PCT Pub. Date: Jul. 2, 1998

[51] Int. Cl.$^6$ .................................................. H03L 7/095
[52] U.S. Cl. .............................. 331/1 A; 331/14; 331/17; 331/25; 331/DIG. 2; 327/159; 375/376
[58] Field of Search ................................ 331/1 A, 14, 17, 331/23, 25, DIG. 2; 327/156–159; 375/326, 344, 376

[56] References Cited

U.S. PATENT DOCUMENTS

| | | | |
|---|---|---|---|
| 3,535,651 | 10/1970 | Peterson | 331/4 |
| 4,115,745 | 9/1978 | Egan | 331/17 |
| 4,388,598 | 6/1983 | Egan | 331/4 |
| 5,148,123 | 9/1992 | Ries | 331/4 |
| 5,754,607 | 5/1998 | Powell et al. | 375/373 |

FOREIGN PATENT DOCUMENTS 2368178  5/1978  France .

*Primary Examiner*—David Mis
*Attorney, Agent, or Firm*—Ladas & Parry

[57] ABSTRACT

The invention relates generally to transmission of digitized information and more specifically to a digital receiver locking device that provides a decreased lock-in time and minimizes requirements to a permissible frequency and phase matching error. Outputs of a digital phase detector 1 are coupled, respectively, to an addition input of an analog adder 2 and a first information input of a multiplexer 3 having an output coupled to a subtraction input of the analog adder 2. An output of the adder 2 is connected via a low-pass filter to an input of a voltage controlled oscillator (VCO) 5 having an output connected to a clock input of a decision unit 6 whose information input is coupled, along with a first input of the phase detector 1 and a first input of a lock state detection circuit 7, to an input of the locking device. A second input of the phase detector 1 and a clock input of the decision unit 6 are coupled to an output of the VCO 5. A first output of the lock state detection circuit 7, which is an unlocked state indication output, is coupled to a control input of the multiplexer 3, and a second output of the circuit 7, which is a lock lead/lag indication output, is coupled to a second information input of the multiplexer 3.

6 Claims, 4 Drawing Sheets

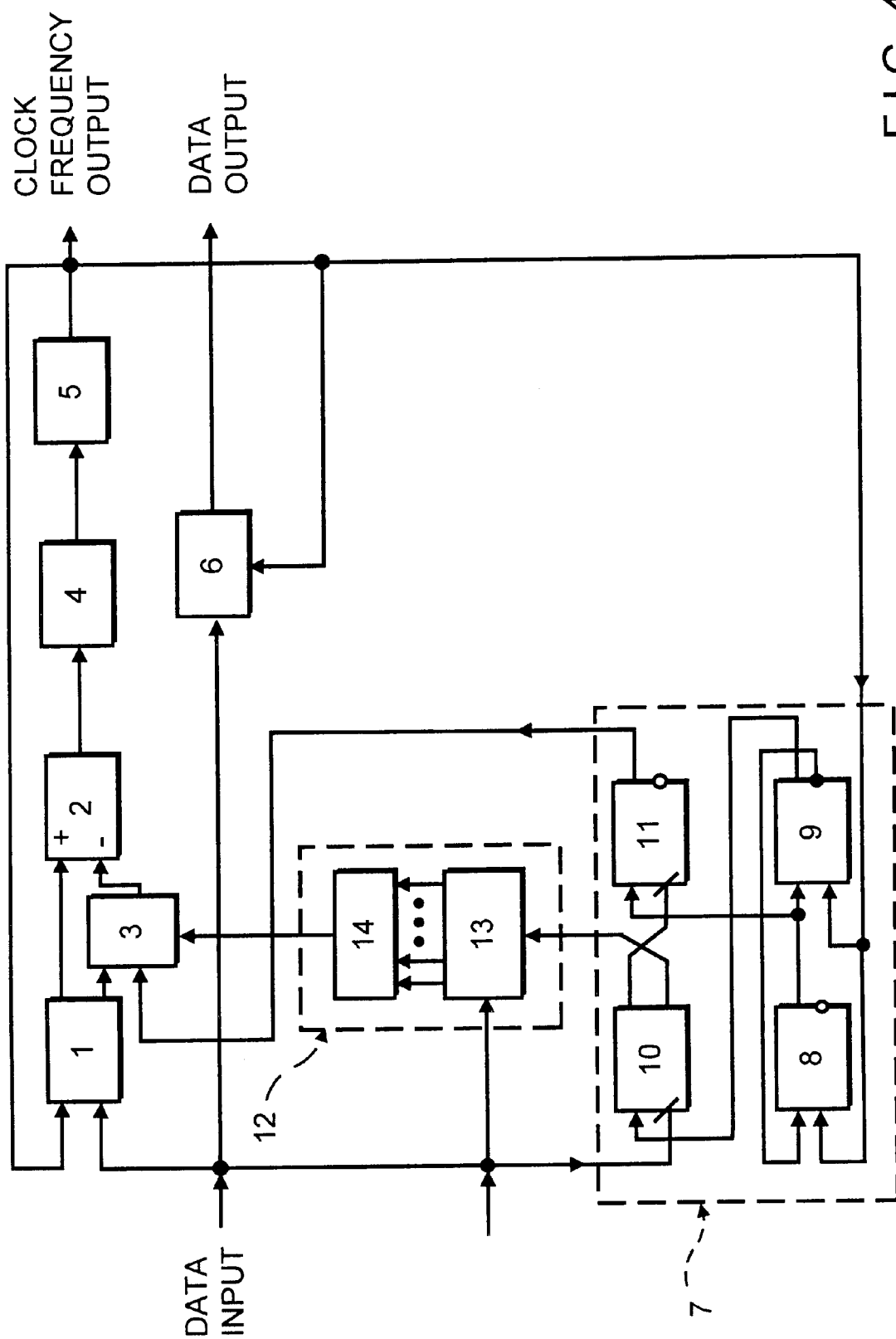
F I G. 4

1

DIGITAL RECEIVER LOCKING DEVICE

FIELD OF THE INVENTION

The present invention relates generally to transmission of digitized information and more specifically to a device for locking a receiver to a transmitter, using digital signal characteristics to control a phase of a voltage controlled oscillator.

BACKGROUND OF THE INVENTION

It is known that a receiver can be locked by input data a through a locking device with a phase-locked loop (PLL) circuit including a voltage controlled oscillator. The oscillator signal is employed to clock the writing of input data to a locking device and to track the input data at further transmission of the received signals to the other apparatuses. The locked condition is achieved at definite limitations on the initial matching error in phase and frequency of the voltage controlled oscillator (VCO) and input data (see F. M. Gardner. Phaselock Technique. J. Wiley & Sons, 1979, ch.4). If initial frequency or/and phase values exceed permissible limits, the PLL circuit will not achieve the locked condition. To expand the range of the initial frequency and phase values at which the PLL circuit can be locked by input data, a forced variation of frequency and/or phase is employed.

In digital communication system receivers, the PLL circuit can be phase locked to the VCO through the use, within the PLL circuit, of a phase detector and a supplementary unit for forced scanning of the controlled oscillator frequency (see F. M. Gardner. Phaselock Technique. J. Wiley & Sons, 1979, ch.5) or an input signal phase (T. N. Lee, J. F. Bulzacchelly. 155 MHz Clock Recovery Delay-and-Phase-Locked Loop. IEEE Journal of Solid State Circuits, v.27, No.12, pp 1736–1745). With the prior art device, a locking band of the PLL circuit is expanded owing to a coarse frequency or phase lock during scanning.

Described in F. M. Gadner. Phaselock Technique. J. Wiley & Sons, 1979, ch.5, is a digital receiver locking device comprising a phase detector and a decision unit, each one having inputs to which an information signal is provided, a VCO for generating a clock frequency for the phase detector and the decision unit, a low-pass filter (LPF) having an input coupled to an output of the phase detector, an analog adder having one input coupled to an output of the LPF, another input coupled to a saw-tooth generator via a controllable switch, and an output coupled to a control input of the VCO, and a block information signal decoder having an input coupled to an output of the decision unit, and an output coupled to a control input of the switch. The saw-tooth generator, the switch and the analog adder make up a frequency scanning unit.

In the above apparatus, a digital data signal is generated at the output of the decision unit, and a clock frequency locked to the digital signal is generated at the output of the VCO. If a block lock condition is systematically lost, the decoder generates a scanning enable signal, responsive to which the switch connects an output of the saw-tooth generator to an input of the adder. As the result, a saw-tooth voltage is generated at the adder output, causing a variation in the VCO generation frequency. Scanning of the VCO generation frequency is terminated when the decoder generates a control signal of appropriate level, that is provided to the switch.

A problem with the prior art locking device is a considerable time spent for initial locking. The reason is that a short-term loss of the PLL lock condition may result in scanning a control signal in a direction opposite to the optimum one.

Closely approaching the claimed invention from the viewpoint of technical essence is a locking device comprising a digital phase detector having a delay unit at an input and an analog adder at an output, a LPF and a VCO based on a quartz-crystal generator. An input data signal is provided to a first input of the delay unit, the delayed data from an output of the delay unit are, in turn, provided to first inputs of the phase detector and decision unit. From the LPF output, a signal is provided to a second control input of the delay unit. A signal of the VCO is provided to second inputs of the phase detector and decision unit. The phase detector has several outputs of a first and second type. Averaged weighted amplitude values of pulses generated at the inputs of the first and second type are used as the estimates of the VCO frequency lag and lead, respectively, relative to the input data frequency. To obtain the estimates, the analog adder combines appropriately weighted voltages generated at the first type outputs of the phase detector, and subtracts appropriately weighted voltages generated at the second type outputs of the phase detector. An output signal of the analog adder is averaged by the LPF, the averaged signal being provided to control inputs of the VCO and delay unit. To lock the VCO by input data, the oscillator frequency should be equal to a code generation frequency. A digital signal is provided from an output of the decision unit, and a clock frequency locked to the received digital signal is generated at the VCO output (see the aforementioned reference of T. H. Lee, J. F. Bulzacchelly).

The prior art locking device, however, exhibits a narrow locking band of the PLL circuit, resulting in a necessity to use a VCO based on a quartz-crystal resonator.

SUMMARY OF THE INVENTION

It is an object of the present invention to provide a digital receiver locking device that overcomes the aforementioned problems through a directional scanning of the VCO frequency when the locked state is lost, until the lock-in condition is achieved. It ensures a decreased lock-in time and minimizes requirements to a minimum permissible phase and frequency matching error.

The aforementioned technical result is attained by a first embodiment of a digital receiver locking device comprising a digital phase detector, an analog adder having an addition input coupled to a first output of the phase detector, a low-pass filter having an input coupled to an output of the analog adder, a voltage controlled oscillator having an input coupled to an output of the low-pass filter, and an output coupled to one input of the phase detector, another input of the phase detector being coupled to an input of the digital receiver locking device, and a decision unit having an information input coupled to an input of the digital receiver locking device, a clock input coupled to an output of the voltage controlled oscillator, and an output coupled to an output of said digital receiver locking device, wherein in accordance with the invention said digital receiver locking device comprises a two-input multiplexer having a first information input coupled to a second output of the digital phase detector, and an output coupled to a subtraction input of the analog adder, and lock state detection circuit having a first input coupled to an input of the digital receiver locking device, a second input coupled to an output of the voltage controlled oscillator, a first output coupled to a control input of the two-input multiplexer, and a second output coupled to a second information input of the two-input multiplexer.

The aforementioned technical result is further attained by a second embodiment of a digital receiver locking device comprising a digital phase detector, an analog adder having an addition input coupled to a first output of the digital phase detector, a low-pass filter having an input coupled to an output of the analog adder, a voltage controlled oscillator having an input coupled to an output of the low-pass filter, and an output coupled to one input of the digital phase detector, another input of the phase detector being coupled to an input of the digital receiver locking device, and a decision unit having an information input coupled to an input of the digital receiver locking device, a clock input coupled to an output of the voltage controlled oscillator, and an output coupled to an output of said digital receiver locking device, wherein in accordance with the invention said digital receiver locking device further comprises a two-input multiplexer having a first information input coupled to a second output of the digital phase detector, and an output coupled to a subtraction input of the analog adder, a lock state detection circuit having a first input coupled to an input of the digital receiver locking device and a second input coupled to an output of the voltage controlled oscillator, and a digital integrator having an information input coupled to a first output of the lock state detection circuit, a clock input coupled to an input of the digital receiver locking device, and an output coupled to a control input of the two-input multiplexer, a second output of the lock state detection circuit being coupled to a second information input of the two-input multiplexer.

The digital integrator preferably comprises a shift register and an AND-gate having inputs coupled to information outputs of the shift register whose a clock input is coupled to a clock input of the digital integrator, an information input of the shift register being coupled to an information input of the digital integrator, and an output of the AND-gate being coupled to an output of the digital integrator.

The lock state detection circuit, both in the first and second embodiments, preferably comprises a first, second, third and forth flip-flops, clock inputs of the first and second flip-flops being coupled to a second input of the lock state detection circuit, a direct output of the first flip-flop being coupled to an information input of the second flip-flop having an inverse output coupled to an information input of the first flip-flop, a clock input of a third flip-flop being coupled to a first input of the lock state detection circuit, an information input of the third flip-flop being coupled to a direct output of the second flip-flop, a direct output of the third flip-flop being coupled to a clock input of the forth flip-flop having an information input coupled to a direct output of the first flip-flop, an inverse output of the third flip-flop being coupled to a first output of the lock state detection circuit, and a direct output of the forth flip-flop being coupled to a second output of the lock state detection circuit.

In the digital receiver locking device in accordance with the invention, the lock state detection circuit continuously compares time of arrivals of the falling edges of input data to the VCO signal. If the locked state is lost, said unit generates signals of an unlocked condition and lead/lag indication, by determining a relationship between the input data signal and VCO signal frequencies and phases. To perform this function, an average VCO frequency is selected either equal to a double code generation frequency for input data having pulse falling edges corresponding to the end or beginning of a clock interval, for example, for the NRZ signal, or equal to a code generation frequency for input data having pulse falling edges corresponding to the end of a clock interval, for example, for the CMI signal. On generation of a high level signal indicating the loss of a locked condition, one of the phase detector outputs is disabled and a constant level signal indicating the lock lead or lag is provided to the analog adder. The lead/lag indication signal level is set so as to correspond to a level of a signal at the output of the phase detector to which the multiplexer is coupled. For example, if, on a lead, the phase detector generates a high average level, then said signal level should be also high and vice versa. When short pulses are present at the phase detector outputs and a constant signal is provided to one of the analog adder inputs, the LPF integrates the signal and generates a slowly increasing or decreasing control voltage for the VCO, depending on whether the VCO signal frequency and phase lag or lead those of input data. In this case, the VCO frequency is changing in a proper direction until a locked condition is achieved.

If input data may contain noise, a digital integrator including a shift register and a gate is provided between the lock state detection circuit and the control input of the multiplexer. The gate generates a high level corresponding to an unlocked state indication and causing a VCO control signal to be scanned when the shift register contains all "ones", and a low level in the opposite case. As the result, the impact of noise upon the stable operation of the PLL circuit including the phase detector, analog adder, LPF and VCO will be avoided.

BRIEF DESCRIPTION OF THE DRAWINGS

The present invention will be more clearly understood from the following detailed description of its embodiments, taken in conjunction with the accompanying drawings in which

FIG. 4 is a block diagram of a second embodiment of a digital receiver locking device in accordance with the present invention.

DESCRIPTION OF THE PREFERRED EMBODIMENTS

Figure 1:
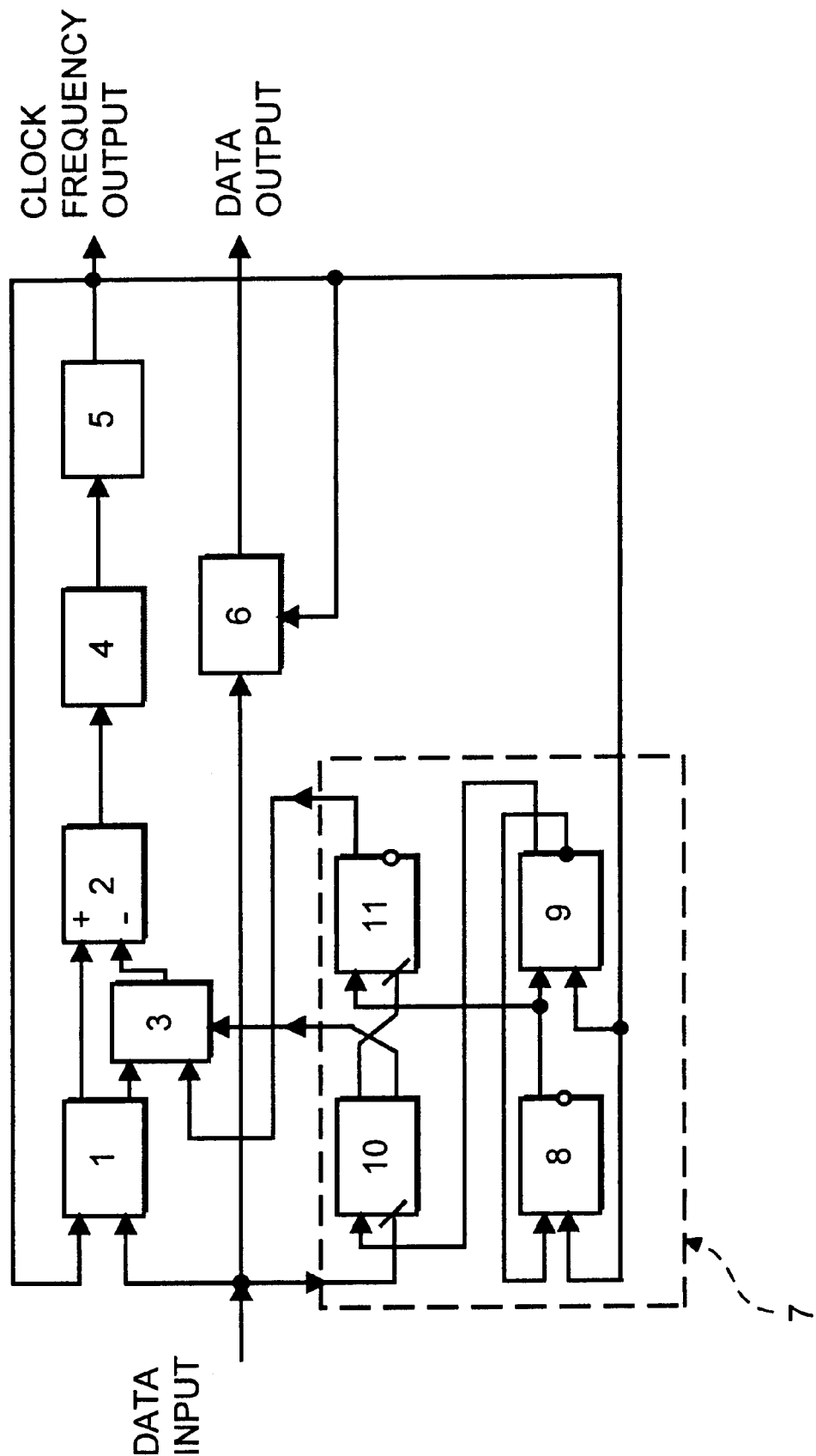
FIG. 1 is a block diagram of a first embodiment of a digital receiver locking device in accordance with the present invention.

Referring to FIG. 1, a digital receiver locking device is shown as comprising a digital phase detector 1 having outputs connected to an addition input of an analog adder 2 and to a first information input of a two-input multiplexer 3, respectively, an output of the two-input multiplexer being connected to a subtraction input of the analog adder 2. An output of the adder 2 is coupled to an input of a LPF 4 whose output is coupled to an input of a VCO 5. An output of the VCO 5 is connected to a clock input of the decision unit 6 whose information input is coupled to an input of the digital receiver lock device, to which also coupled are a first input of the phase detector 1 and a first input of a lock state detection circuit 7. A second input of the circuit 7, a second input of the phase detector 1 and a clock input of the decision unit 6 are coupled to an output of the VCO 5. A first output of the lock state detection circuit 7, which is an unlocked state indication output, is coupled to a control input of a two-input multiplexer 3 having a second information input connected to a second input of the circuit 7, which is a lock lead/lag indication output.

As shown in FIG. 1, the lock state detection circuit 7 comprises a first flip-flop 8, a second flip-flop 9, a third flip-flop 10 and a forth flip-flop 11, wherein the flip-flops 10, 11 are clocked by the pulse signal falling edge, the flip-flop 8 is clocked by a high level, and the flip-flop 9 is clocked by a low level. Clock inputs of the first and second flip-flops 8,9 are connected to a second input of the lock state detection circuit 7. A direct output of the first flip-flop 8 is coupled to an information input of the second flip-flop 9, an inverse output of which is coupled to an information input of the first flip-flop 8. A clock input of the third flip-flop 10 is coupled to a first input of the lock state detection circuit 7. An information input of the third flip-flop 10 is coupled to a direct input of the second flip-flop 9, and a direct output of the third flip-flop 10 is coupled to a clock input of the forth flip-flop 11 whose information input is connected to a direct output of the first flip-flop 8. An inverse output of the third flip-flop 10 is coupled to a first output of the lock state detection circuit 7, and a direct output of the forth flip-flop 11 is coupled to a second output of the lock state detection circuit.

An embodiment of a digital receiver locking device depicted in FIG. 4 differs over the embodiment of FIG. 1 by the fact that it further comprises a digital integrator 12 having an information input coupled to a first output of the lock state detection circuit 7, a clock input coupled to an input of the locking device and an output connected to a control input of the two-input multiplexer. The digital integrator 12 includes a shift register 13 with parallel outputs, that is clocked by a rising edge of an input signal, and an AND-gate 14 generating a high level at the output thereof when the register 13 contains all "ones". Inputs of the AND-gate 14 are coupled, respectively, to information outputs of the shift register 13 having a clock input coupled to a clock input of the digital integrator 12 and an information input coupled to an information input of the digital integrator 12, an output of the AND-gate 14 being coupled to an output of the digital integrator 12.

Figure 2A:
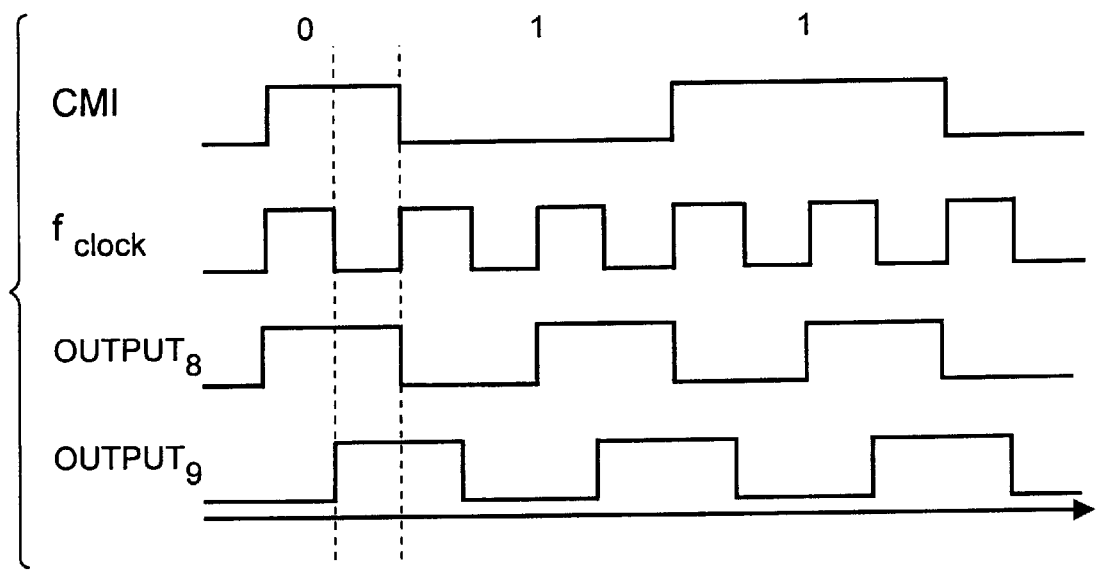
FIGS. 2a and 2b present diagrams of voltage distribution at inputs and outputs of the digital receiver locking device units for the CMI input data signals.
Figure 2B:
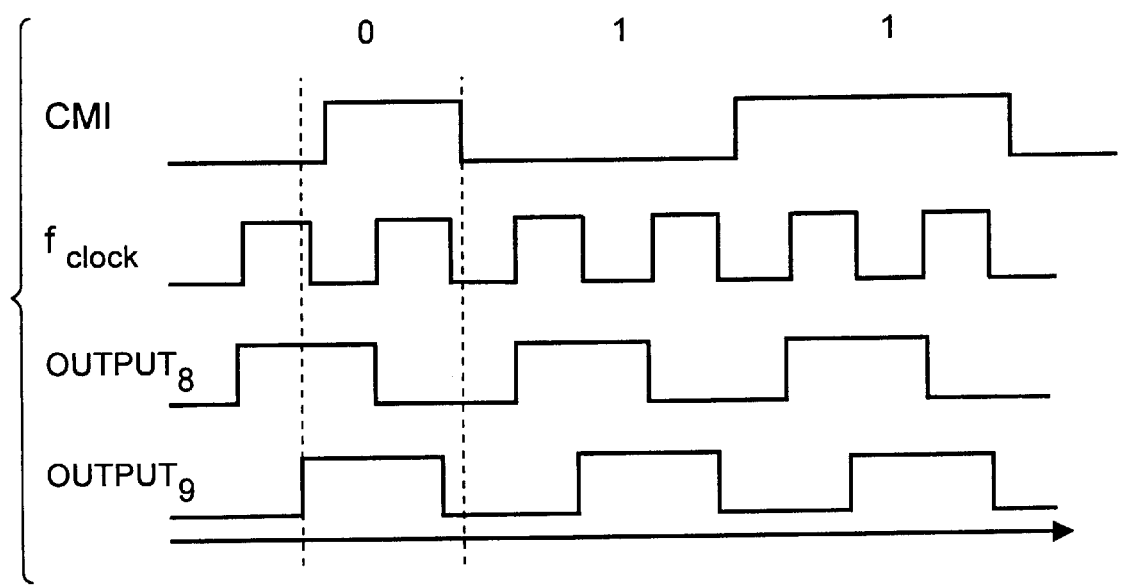

A digital receiver locking device operates as follows. Initially, when a lock condition is absent, a phase of the VCO 5 signal "slips" relative to a phase of an input data signal. At some point in time, "1" is written to the flip-flop 10 by the falling edge of the input data pulses, and then "0". This gives rise to generation of properly set levels of lock state and lead/lag indication signals at a first and second outputs, respectively, of the lock state detection circuit 7. To lock the VCO 5 by input data, there exists a definite relationship between the input data and VCO signal frequency and phase: a falling edge of the VCO signal clocks data so that the signal falling edge is aligned with the center of a data pulse. FIG. 2.a illustrates a proper relationship between phases of said signals when the input data is of the CMI format. The flip-flops 8 and 9 are connected by a frequency divider scheme. An output signal of the flip-flop 9 is 90 degree shifted relative to an output signal of the flip-flop 8. Falling edges of the CMI signal are aligned with the center of the output signal pulse of the flip-flop 9. Therefore, in a locked condition, "1" is always written to the flip-flop 10. If a phase of the VCO 5 signal leads the input data signal, then, as shown in FIG. 2.b, at some point in time, "0" is written to the flip-flop 10 by the falling edge. Since in this case, a signal flock of the VCO 5 can not clock the data due to the edge misalignment, the signal is no longer locked to the input data. If the input data leads the signal of the VCO 5, "0" will be also written to the flip-flop 10 by the falling edge. Therefore, a signal level at the output of the flip-flop 10 serves to monitor a lock state of the VCO 5 signal and the input data, level "1" corresponding to a locked condition and level "0" corresponding to an unlocked condition.

If before the lock is lost, "1" has been written to the flip-flop 10, "0" will be written when the locked condition is lost, and the flip-flop 11 will generate a pulse at the clock output, by the falling edge of which the information from the output of the flip-flop 8 will be written to this flip-flop, particularly, "0" will be written if the VCO 5 signal leads the input data signal (FIG. 2.b) and "1" will be written if the VCO 5 signal phase lags the input data signal.

Figure 3:
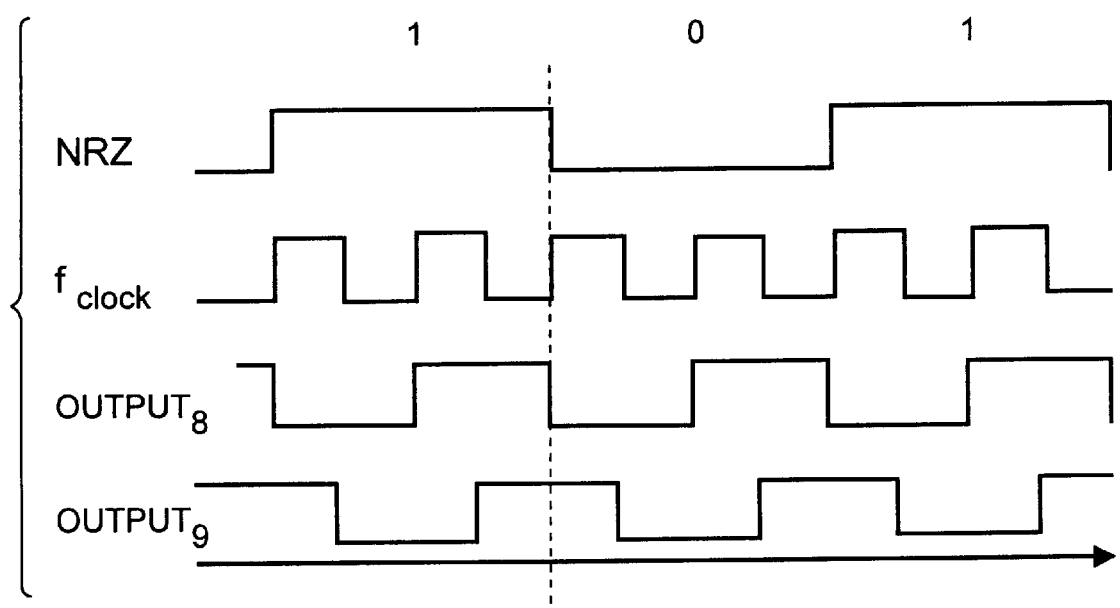
FIG. 3 presents diagrams of voltage distribution at inputs and outputs of the digital receiver locking device units for the NRZ input data signals.

FIG. 3 illustrates a proper relationship between the VCO 5 signal and input data phases for the NRZ signal. In this case, a generation frequency of the VCO 5 is equal to a double code generation frequency. It follows from comparison of FIGS. 2b and 3 that the phase relations for the CMI data are also true for the NRZ data, i.e. the lock state (locked or unlocked) indication and lead/lag signals are generated at the same phase relationships.

A direct or inverse lock indication signal is provided to an input of the multiplexer 3. In the embodiment depicted in FIG. 3, a signal from the inverse output of the flip-flop 10 is employed as a control signal in the multiplexer 3. In particular, if a low level is generated at the inverse output of the flip-flop 10, i.e. the device is in the locked condition, the phase detector 1 will be connected to the analog adder 2. But if a high level has been generated at the inverse output of the flip-flop 10, a constant level is provided from the flip-flop 11 to a corresponding input of the analog adder 2. As shown in FIG. 1, an output of the multiplexer 3 is coupled to a subtraction input of the analog adder 2. From FIG. 2.b it follows that when the VCO 5 signal leads the input data, a low level is generated at the output of the flip-flop 11. The LPF 4 converts the constant low level at the subtraction input of the analog adder 2 to a voltage increasing with time, that is applied as a control signal to the VCO 5 with the result that the VCO 5 frequency will be decreased. If the VCO 5 frequency should increase with voltage, the inverse output of the flip-flop 11 is to be employed. Therefore, when the locked condition is lost, the VCO frequency is scanned so that to eliminate the frequency and phase mismatch between the VCO 5 signal and input data. In a locked condition, (FIGS. 2.a and 3), the indication signal is inverted, and the second output of the phase detector 1 is coupled to the subtraction input of the analog adder 2. With a minor matching error, the device maintains the locked condition only by the FLL circuit with a phase detector. The matching error being great, the locked condition will be achieved after several iterations. In the locked condition, input data is written to the decision unit 6, wherein a signal from the VCO 5 is used as clock pulses. The data appears at the output of the decision unit 6 synchronously with the pulses of the VCO 5 signal.

In-line noise can cause a false response of the locking device, which results in undesired scanning of the VCO 5 frequency. To avoid this, the locking device can further comprise a digital integrator 12 (FIG. 4) based on a shift register 13 with parallel outputs, which is clocked by a rising edge of the input signal, and an AND gate 14 for generating a high level when the shift register 13 contains all "1's". In this embodiment, the signal level required to start scanning the VCO 5 frequency, that indicates an unlocked state, is generated when the unlocked state is repeatedly registered at the inverse output of the flip-flop 10. In order to reduce noise, a length of the shift register 13 is selected with account of a probable maximum noise duration value.

Industrial Applicability

A digital receiver locking device in accordance with the present invention is applicable to synchronous digital communication systems.

We claim:

1. A digital receiver locking device comprising:

a digital phase detector (1), an analog adder (2) having an addition input coupled to a first output of the phase detector (1), a low-pass filter (4) having an input coupled to an output of the analog adder (2), a voltage controlled oscillator (5) having an input coupled to an output of the low-pass filter (4), and an output coupled to one of inputs of the phase detector (1), another input of the phase detector being coupled to an input of the digital receiver locking device, and a decision unit (6) having an information input coupled to an input of the digital receiver locking device, a clock input coupled to an output of the voltage controlled oscillator (5), and an output coupled to an output of said locking device, said digital receiver locking device characterized in that it further comprises a two-input multiplexer (3) having a first information input coupled to a second output of the digital phase detector (1), and an output coupled to a subtraction input of the analog adder (2), and a lock state detection circuit (7) having a first input coupled to an input of the digital receiver locking device, a second input coupled to an output of the voltage controlled oscillator (5), a first output coupled to a control input of the two-input multiplexer (3), and a second output coupled to a second information input of the two-input multiplexer (3).

2. A device as set forth in claim 1, wherein the lock state detection circuit (7) further comprises a first flip-flop (8), second flip-flop(9), third flip-flop (10) and forth flip-flop (11), clock inputs of the first flip-flop (8) and second flip-flop (9) being coupled to a second input of the lock state detection circuit (7), a direct output of the first flip-flop (8) being coupled to an information input of the second flip-flop (9), whose inverse input is coupled to an information input of the first flip-flop (8), a clock input of a third flip-flop (10) being coupled to a first input of the lock state detection circuit (7), an information input of the third flip-flop (10) being coupled to a direct output of the second flip-flop (9), a direct output of the third flip-flop (10) being coupled to a clock input of the forth flip-flop (11), an information input of which is coupled to a direct output of the first flip-flop (8), an inverse output of the third flip-flop (10) being coupled to a first output of the clock state detection circuit (7), and a direct output of the forth flip-flop (11) being coupled to a second output of the lock state detection circuit (7).

3. A digital receiver locking device comprising a digital phase detector (1), an analog adder (2) having an addition input coupled to a first output of the digital phase detector (1), a low-pass filter (4) having an input coupled to an output of the analog adder (2), a voltage controlled oscillator (5) having an input couped to an output of the low-pass filter (4), and an output coupled to one of the inputs of the digital phase detector (1), another input the phase detector being coupled to an input of the digital receiver locking device, and a decision unit (6) having an information input coupled to an input of the digital receiver locking device, a clock input coupled to an output of the voltage controlled oscillator (5), and an output coupled to an output of said locking device, said digital receiver locking device characterized in that it further comprises a two-input multiplexer (3) having a first information input coupled to a second output of the digital phase detector (1), and an output coupled to a subtraction input of the analog adder (2), a lock state detection circuit (7) having a first input coupled to an input of the digital receiver locking device, a second input coupled to an output of the voltage controlled oscillator (5), and a digital integrator (12) having an information input coupled to a first output of the lock state detection circuit (7), a clock input coupled to an input of the digital receiver locking device, and an output coupled to a control input of the two-input multiplexer (3), a second output of the lock state detection circuit (7) being coupled to a second information input of the two-input multiplexer (3).

4. A device as set forth in claim 3, wherein the digital integrator (12) further comprises an shift register (13) and an AND-gate (14) having inputs coupled to information outputs of the shift register (13), a clock input of the shift register (13) being coupled to a clock input of the digital integrator (12), an information input of the shift register (13) being coupled to an information input of the digital integrator (12) and an output of the AND-gate (14) being coupled to an output of the digital integrator (12).

5. A device as set forth in claim 3, wherein the lock state detection circuit (7) further comprises a first flip-flop (8), second flip-flop (9), third flip-flop (10) and forth flip-flop (11), clock inputs of the first flip-flop (8) and second flip-flop (9) being coupled to a second input of the lock state detection circuit (7), a direct output of the first flip-flop (8) being coupled to an information input of the second flip-flop (9), whose inverse input is coupled to an information input of the first flip-flop (8), a clock input of a third flip-flop (10) being coupled to a first input of the lock state detection circuit (7), an information input of the third flip-flop (10) being coupled to a direct output of the second flip-flop (9), a direct output of the third flip-flop (10) being coupled to a clock input of the forth flip-flop (11), an information input of which is coupled to a direct output of the first flip-flop (8), an inverse output of the third flip-flop (10) being coupled to a first output of the clock state detection circuit (7), and a direct output of the forth flip-flop (11) being coupled to a second output of the lock state detection circuit (7).

6. A device as set forth in claim 4, wherein the lock state detection circuit (7) further comprises a first flip-flop (8), second flip-flop (9), third flip-flop (10) and forth flip-flop (11), clock inputs of the first flip-flop (8) and second flip-flop (9) being coupled to a second input of the lock state detection circuit (7), a direct output of the first flip-flop (8) being coupled to an information input of the second flip-flop (9), whose inverse input is coupled to an information input of the first flip-flop (8), a clock input of a flip-flop (10) being coupled to a first input of the lock state detection circuit (7), an information input of the third flip-flop (10) being coupled to a direct output of the second flip-flop (9), a direct output of the third flip-flop (10) being coupled to a clock input of the forth flip-flop (11), an information input of which is coupled to a direct output of the first flip-flop (8), an inverse output of the third flip-flop (10) being coupled to a first output of the clock state detection circuit (7), and a direct output of the forth flip-flop (11) being coupled to a second output of the lock state detection circuit (7).

* * * * *